United States Patent
Yamazaki

(10) Patent No.: US 8,089,131 B2
(45) Date of Patent: Jan. 3, 2012

(54) MICRO MOVABLE DEVICE

(75) Inventor: Hiroaki Yamazaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 12/502,500

(22) Filed: Jul. 14, 2009

(65) Prior Publication Data

US 2010/0038732 A1  Feb. 18, 2010

(30) Foreign Application Priority Data

Aug. 13, 2008  (JP) ................................. 2008-208691

(51) Int. Cl.
- H01L 27/14 (2006.01)
- H01L 29/82 (2006.01)
- H01L 29/84 (2006.01)
- H01L 23/02 (2006.01)

(52) U.S. Cl. ......... 257/415; 257/414; 257/678; 257/419

(58) Field of Classification Search .................. 257/415, 257/678, 418, 419, 773; 216/2, 72, 79
See application file for complete search history.

(56) References Cited

U.S. PATENT DOCUMENTS 7,317,317 B1   1/2008  Vermeire et al.

FOREIGN PATENT DOCUMENTS

JP  2007-222956  9/2007

OTHER PUBLICATIONS

U.S. Appl. No. 12/402,031, filed Mar. 11, 2009, Shigeru Hiura et al.

*Primary Examiner* — Chuong A. Luu

(74) *Attorney, Agent, or Firm* — Oblon, Spivak, McClelland, Maier & Neustadt, L.L.P.

(57) ABSTRACT

A micro movable device includes a protection cap for protecting a movable unit arranged above a semiconductor substrate and the movable unit, signal line for transmitting a high-frequency signal formed above the semiconductor substrate, and insulation layer that has projection formed to project upward from the semiconductor substrate and coated surfaces with the signal line.

20 Claims, 13 Drawing Sheets

MICRO MOVABLE DEVICE

CROSS-REFERENCE TO RELATED APPLICATIONS

This application is based upon and claims the benefit of priority from the prior Japanese Patent Application No. 2008-208691, filed on Aug. 13, 2008; the entire contents of which are incorporated herein by reference.

BACKGROUND

A micro electro mechanical system (MEMS) is configured by having mechanical parts, a sensor, an actuator, and an electronic circuit integrated together on the same substrate. The MEMS is used for various devices such as a printer head and a pressure sensor.

When the MEMS is used as a high-frequency device such as an impedance matching circuit and a high-frequency switch, losses can be suppressed.

Meanwhile, at the time of integrating mechanical parts and the like together on the same substrate, these mechanical parts can be easily integrated with electronic parts while using the same semiconductor manufacturing process. Therefore, a silicon substrate is used in many cases. When a cavity structure is formed on the silicon substrate, a movable unit is manufactured above the silicon substrate, and by performing an operation while using oscillation or deflection of the movable unit, characteristics of the MEMS can be obtained.

In the MEMS, to prevent the cavity structure formed on the silicon substrate from being crushed in a molding process and the like, the cavity structure is protected by a protection cap arranged above the silicon substrate. This protection cap is required with a gap between a pad formed on the silicon substrate and the protection cap to make it possible to connect the pad by wire bonding.

For example, Japanese Patent Application Laid-open No. 2007-222956 discloses the following method. A wiring layer is formed to surround a MEMS structure, and a silicon nitride film continuous from above the wiring layer to above the MEMS structure is formed. Plural openings are then formed on the silicon nitride film, and a cavity is formed between the semiconductor substrate and the silicon nitride film. The openings of the silicon nitride film are then closed, thereby air-tightly sealing the inside of the cavity.

However, when a MEMS is formed on a silicon substrate, a parasitic capacitance is generated between a wiring layer formed on the silicon substrate and the silicon substrate. Therefore, there is a problem that a high-frequency characteristic is degraded.

When a cavity structure is formed in the entire wiring region to reduce the parasitic capacitance between the wiring layer and the silicon substrate, the cavity structure is deviated from the protection cap, and this portion is crushed in a molding process and the like. Consequently, according to the conventional MEMS, a cavity structure cannot be provided at the outside of the protection cap. At the outside of the protection cap, a parasitic capacitance between the wiring layer and the silicon substrate cannot be reduced.

BRIEF SUMMARY OF THE INVENTION

A micro movable device according to an embodiment of the present invention comprises: a movable unit formed above a semiconductor substrate; a protection cap that is arranged above the semiconductor substrate and the movable unit and protects the movable unit; a signal line that are formed above the semiconductor substrate and transmit a high-frequency signal, a part of the signal line being provided below the movable unit; and an insulation layer that has a projection formed to project upward from the semiconductor substrate, the projection being provided at outside of the movable unit in a plain view and the insulation layer having a coated surface with the signal line, the coated surface being provided in a higher position than a bottom of the signal line below the movable unit.

A micro movable device according to an embodiment of the present invention comprises: a movable unit formed above a semiconductor substrate; a first insulation layer formed above the semiconductor substrate below the movable unit with a gap between the movable unit and the first insulation layer; a protection cap that is arranged above the first insulation layer and the movable unit and protects the movable unit; a first signal line that is arranged at inside of the protection cap and is formed on the first insulation layer with a gap between the movable unit and the first signal line and a part of the first signal being provided below the movable unit and the first insulation layer; a second insulation layer that are arranged at outside of the protection cap and has a projection formed to project upward from the first insulation layer; and a second signal line electrically connected to the first signal line, and coating a surface of the projection of the second insulation layer, the second signal line being provided in a higher position than the part of the first signal line.

A micro movable device according to an embodiment of the present invention comprises: a movable unit formed above a semiconductor substrate; a first insulation layer formed above the semiconductor substrate below the movable unit with a gap between the movable unit and the insulation layer; a protection cap that is arranged above the first insulation layer and the movable unit and protects the movable unit; a first signal line that is arranged at inside of the protection cap and is formed on the first insulation layer with a gap between the movable unit and the first signal line; a second insulation layer that is arranged at outside of the protection cap and has a projection formed to project upward from the first insulation layer; a second signal line electrically connected to the first signal line, and coating a surface of the projection of the second insulation layer; a first ground line that is arranged at inside of the protection cap and is formed on the first insulation layer; a third insulation layer that is arranged at outside of the protection cap and has a projection formed to project upward from the first insulation layer; and a second ground line electrically connected to the first ground line and coating an entire exposed surface of the third insulation layer.

DETAILED DESCRIPTION OF THE INVENTION

Exemplary embodiments of a micro movable device according to the present invention will be explained below in detail with reference to the accompanying drawings. The present invention is not limited thereto.

Figure 1:
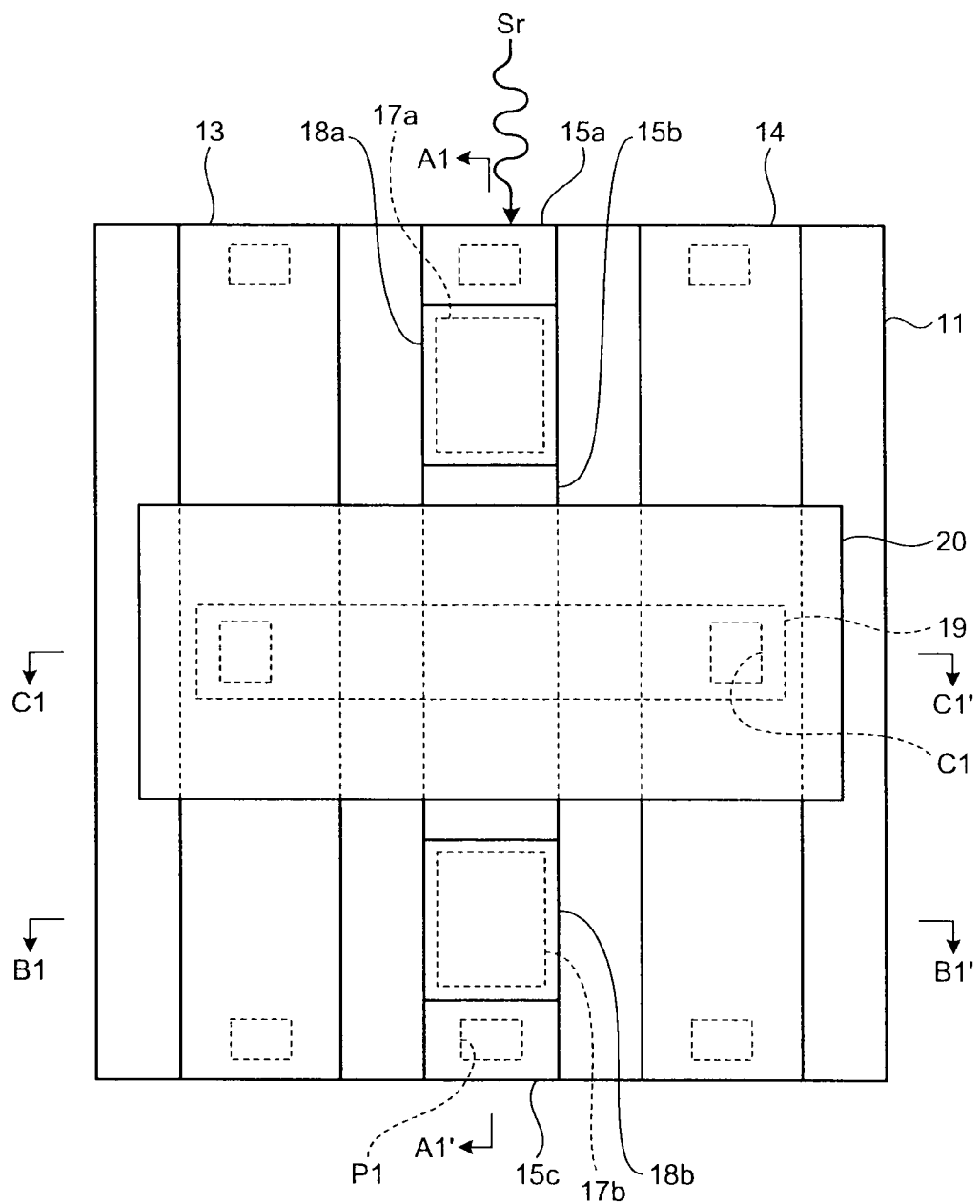
FIG. 1 is a plan view of a schematic configuration of a micro movable device according to a first embodiment of the present invention.
Figure 2A:
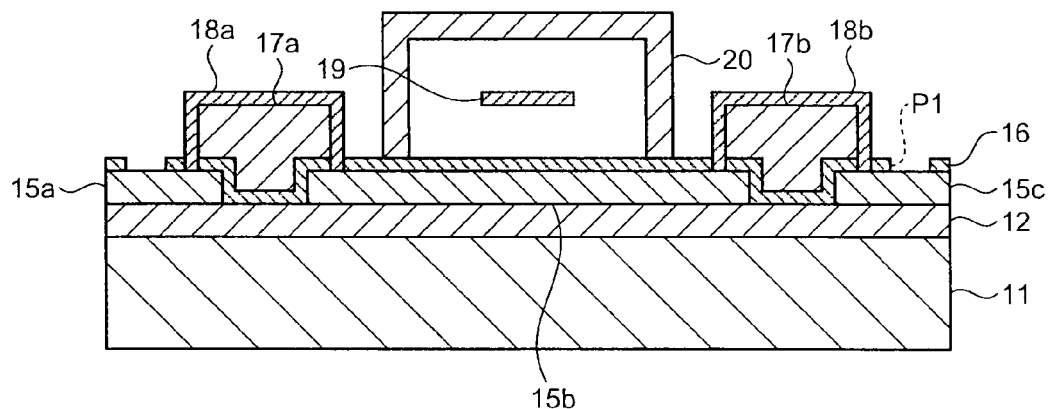
FIG. 2A is a cross-sectional view cut along a line A1-A1' in FIG. 1.
Figure 2B:
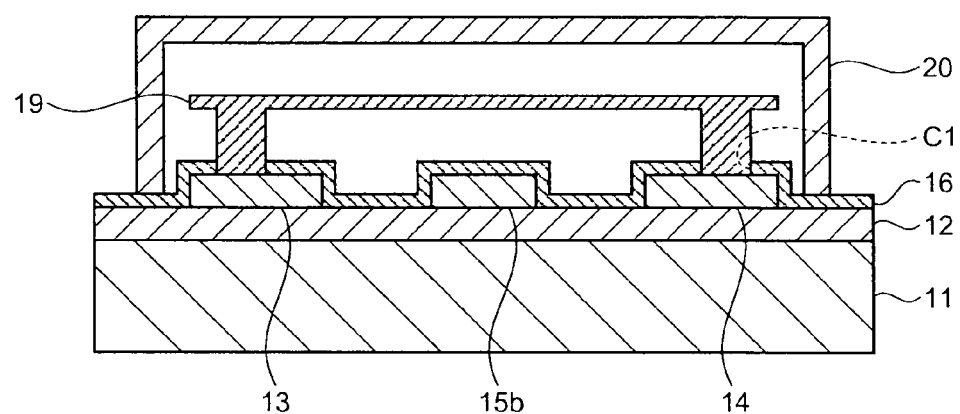
FIG. 2B is a cross-sectional view cut along a line C1-C1' in FIG. 1.
Figure 2C:
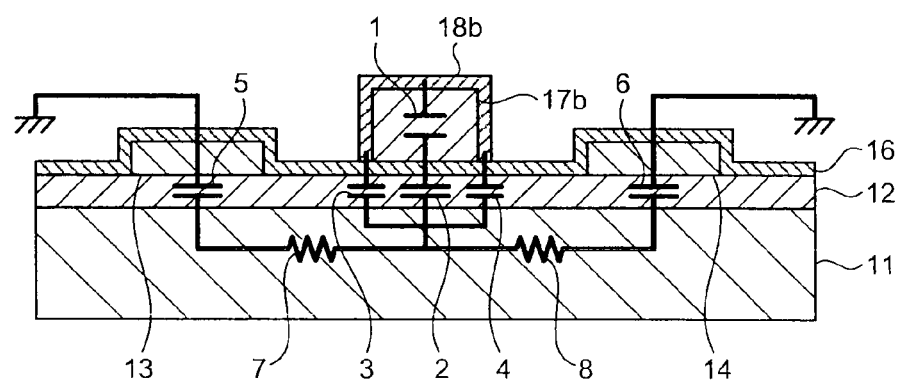
FIG. 2C is a cross-sectional view cut along a line B1-B1' in FIG. 1.

FIG. 1 is a plan view of a schematic configuration of a micro movable device according to a first embodiment of the present invention. FIG. 2A is a cross-sectional view cut along a line A1-A1' in FIG. 1. FIG. 2B is a cross-sectional view cut along a line C1-C1' in FIG. 1. FIG. 2C is a cross-sectional view cut along a line B1-B1' in FIG. 1.

In FIG. 1 and FIGS. 2A to 2C, an insulation layer 12 is formed on a semiconductor substrate 11. Ground lines 13 and 14 are arranged in parallel with each other on the insulation layer 12. Signal lines 15a to 15c physically isolated from each other are arranged between the ground lines 13 and 14. An insulation layer 16 is formed on the ground lines 13 and 14 and on the signal lines 15a to 15c. Pads P1 are formed by exposing ends of the ground lines 13 and 14 and the signal lines 15a and 15c, respectively from the insulation layer 16.

A movable line 19 is formed to stride the signal line 15b above the semiconductor substrate 11, and both ends of the movable line 19 are connected to the ground lines 13 and 14, respectively via contacts C1. The movable line 19 is supported above the semiconductor substrate 11 to have a gap between the movable line 19 and the signal line 15b, and a cavity is formed between the movable line 19 and the signal line 15b.

A protection cap 20 for protecting the movable line 19 from external pressure is arranged above the semiconductor substrate 11 to have a gap between the pads P1 and the protection cap 20.

At the outside of the protection cap 20, a thick-film insulation layer 17a arranged between the signal lines 15a and 15b is formed, and a thick-film insulation layer 17b arranged between the signal lines 15b and 15c is formed, respectively. The thick-film insulation layers 17a and 17b can be formed above the semiconductor substrate 11 to project upward from the signal lines 15a to 15c. Signal lines 18a and 18b are formed to coat entire exposed surfaces of the thick-film insulation layers 17a and 17b, respectively. The signal line 18a is connected to the signal lines 15a and 15b, and the signal line 18b is connected to the signal lines 15b and 15c.

A material of the semiconductor substrate 11 is not limited to silicon, and can be Ge, SiGe, SiC, SiSn, PbS, GaAs, InP, GaP, GaN, ZnSe, GaInAsP, for example. For materials of the insulation layers 12 and 16, a silicon oxide film and a silicon nitride film can be used, for example. For materials of the ground lines 13 and 14, the signal lines 15a to 15c, and the movable line 19, metals such as Al and Cu can be used, for example. For materials of the thick-film insulation layers 17a and 17b, photosensitive polyimide or spin on glass (SOG) can be used, for example. A sacrifice film can be used to form a cavity between the movable line 19 and the signal line 15b.

A position of the movable line 19 in a height direction and positions of the signal lines 18a and 18b in a height direction arranged on the thick-film insulation layers 17a and 17b, respectively can be set equal to each other.

A high-frequency signal Sr such as a radio frequency (RF) is input to the signal lines 15a to 15c and 18a and 18b, and a drive signal for driving the movable line 19 is input. When the signal lines 15a to 15c, and 18a and 18b become in a high potential based on the drive signal, the movable line 19 is pulled to the signal line 15b, and the high-frequency signal Sr flows to the ground lines 13 and 14 based on a capacitance coupling between the movable line 19 and the signal line 15b. On the other hand, when the signal lines 15a to 15c, and 18a and 18b become in a low potential based on the drive signal, a gap between the movable line 19 and the signal line 15b becomes large, and the high-frequency signal Sr passes through the signal lines 15a to 15c, and 18a and 18b without flowing to the ground lines 13 and 14.

When the ground lines 13 and 14 and the signal lines 15a to 15c, 18a and 18b are formed on the semiconductor substrate 11, parasitic resistors 7 and 8 are formed between the ground lines 13 and 14 and the signal line 18b, respectively, as shown in FIG. 2C, for example. Parasitic capacitors 1 to 4 are formed between the signal line 18b and the semiconductor substrate 11, a parasitic capacitor 5 is formed between the ground line 13 and the semiconductor substrate 11, and a parasitic capacitor 6 is formed between the ground line 14 and the semiconductor substrate 11.

When the thick-film insulation layer 17b is formed on the insulation layer 16, the parasitic capacitor 1 can be connected in series with the parasitic capacitor 2, and parasitic capacitance of the signal line 18a can be reduced more than the reduction achieved when the signal line 18a is directly formed on the insulation layer 12. Therefore, parasitic capacitance between the signal lines 18a and 18b and the semiconductor substrate 11 can be reduced without forming a cavity structure in the signal lines 18a and 18b at the outside of the protection cap 20. Consequently, a high-frequency characteristic can be improved while preventing the signal lines 18a and 18b from being crushed in the molding process and the like.

FIGS. 3A to 3C and FIGS. 4A and 4B are cross-sectional views of a method of manufacturing the micro movable device shown in FIG. 1.

Figure 3A:
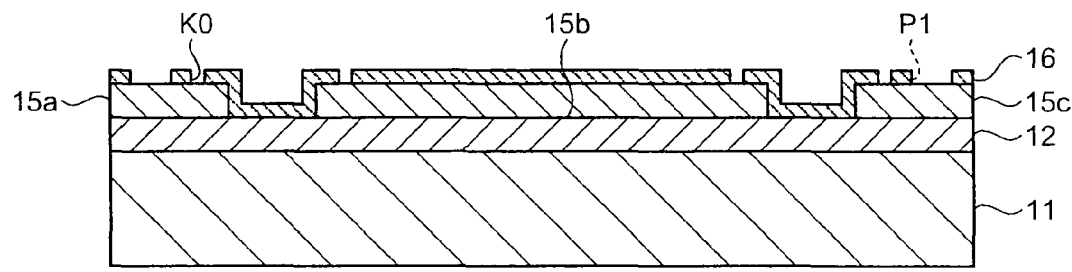
FIGS. 3A to 3C are cross-sectional views of a method of manufacturing the micro movable device shown in FIG. 1.

In FIG. 3A, the insulation layer 12 is formed on the semiconductor substrate 11 by using a chemical vapor deposition (CVD) method or the like. A metal film is formed on the insulation layer 12 by using sputtering or vapor deposition. The metal film is patterned by using a photolithographic technique and an etching technique, thereby forming the ground lines 13 and 14 and the signal lines 15a to 15c shown in FIG. 1.

The insulation layer 16 is formed on the ground lines 13 and 14 and the signal lines 15a to 15c by using the CVD method and the like. The insulation layer 16 is patterned by using the photolithographic technique and the etching technique, thereby forming openings KO arranged at ends of the signal lines 15a to 15c on the insulation layer 16, and forming the pads P1.

Figure 3B:
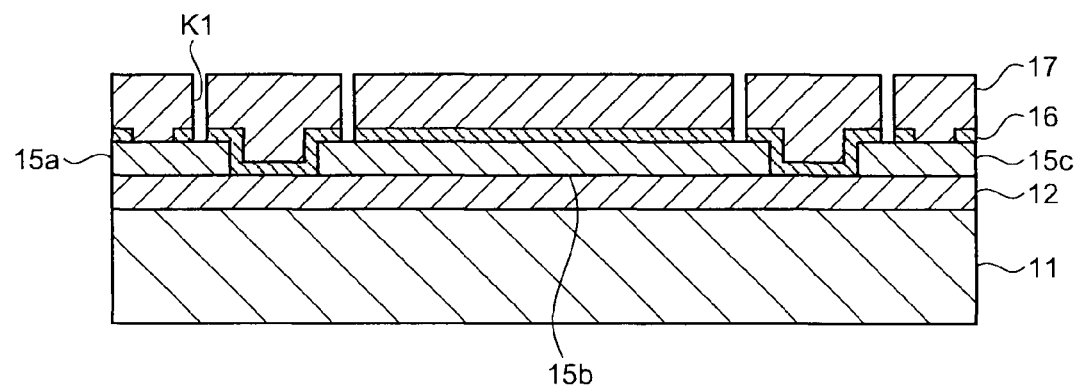

As shown in FIG. 3B, a sacrifice film 17 made of photosensitive polyimide or SOG is formed on the insulation layer 16 by coating or the like. The sacrifice film 17 is patterned by using the photolithographic technique and the etching technique, thereby exposing the ends of the signal lines 15a and 15c via the openings K0, and forming on the sacrifice film 17 openings K1 that isolate the sacrifice film 17 in an island shape between the mutually isolated signal lines 15a to 15c.

Figure 3C:
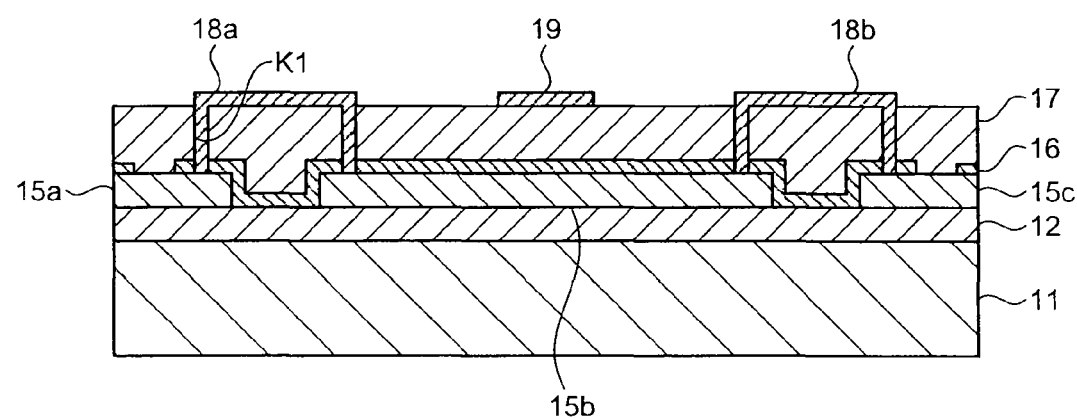

Next, as shown in FIG. 3C, a metal film is formed on the sacrifice film 17 to fill the openings K0 and K1 by sputtering or deposition. The metal film is patterned by using the photolithographic technique and the etching technique, thereby forming the signal lines 18a and 18b and the movable line 19 on the sacrifice film 17.

Figure 4A:
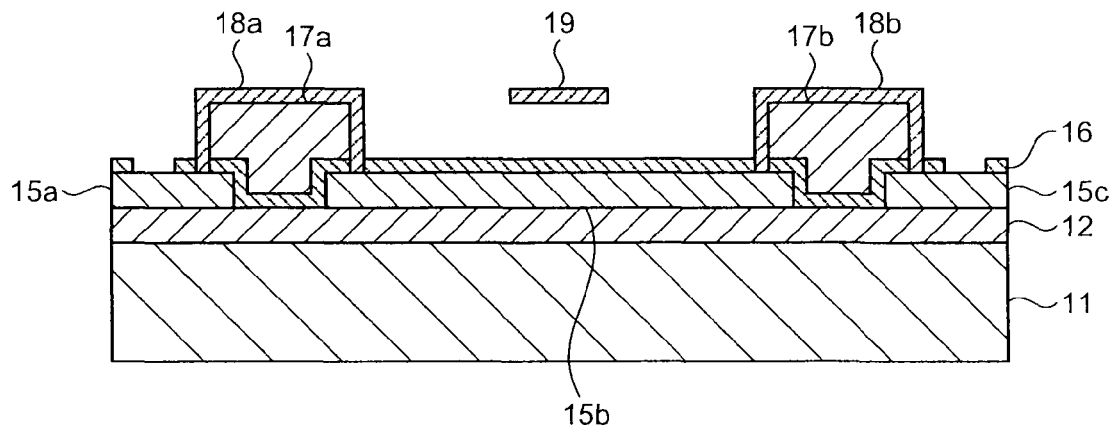
FIGS. 4A and 4B are cross-sectional views of the method of manufacturing the micro movable device shown in FIG. 1.

As shown in FIG. 4A, the sacrifice film 17 is removed from the top of the semiconductor substrate 11 by using a wet etching method or the like, a cavity is formed between the movable line 19 and the signal line 15b, and the thick-film insulation layers 17a and 17b of which entire exposed surfaces are coated by the signal lines 18a and 18b, respectively are formed on the insulation layer 16.

Figure 4B:
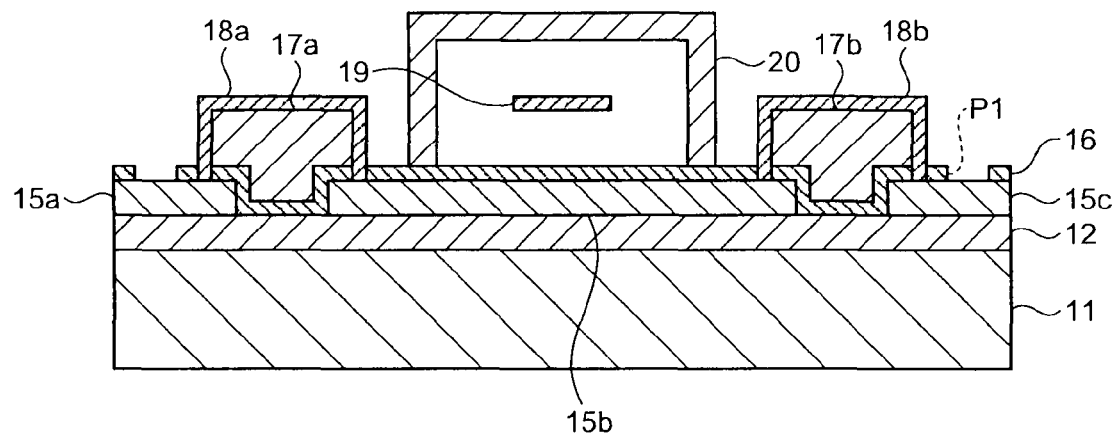

As shown in FIG. 4B, the protection cap 20 for protecting the movable line 19 from external pressure is formed above the semiconductor substrate 11 so that the signal lines 18a and 18b are arranged at the outside of the protection cap 20. Thereafter, a bonding wire is connected to the pads P1, and the semiconductor substrate 11 in its entirety is molded, thereby sealing a MEMS structure on the semiconductor substrate 11.

When the sacrifice film 17 is used for the thick-film insulation layers 17a and 17b and also when entire exposed surfaces of the thick-film insulation layers 17a and 17b are coated by the signal lines 18a and 18b, a separate provision of a process of forming the thick-film insulation layers 17a and 17b is not necessary. Further, at the time of removing the sacrifice film 17, removal of the thick-film insulation layers 17a and 17b can be prevented, thereby simplifying a manufacturing process.

Figure 5:
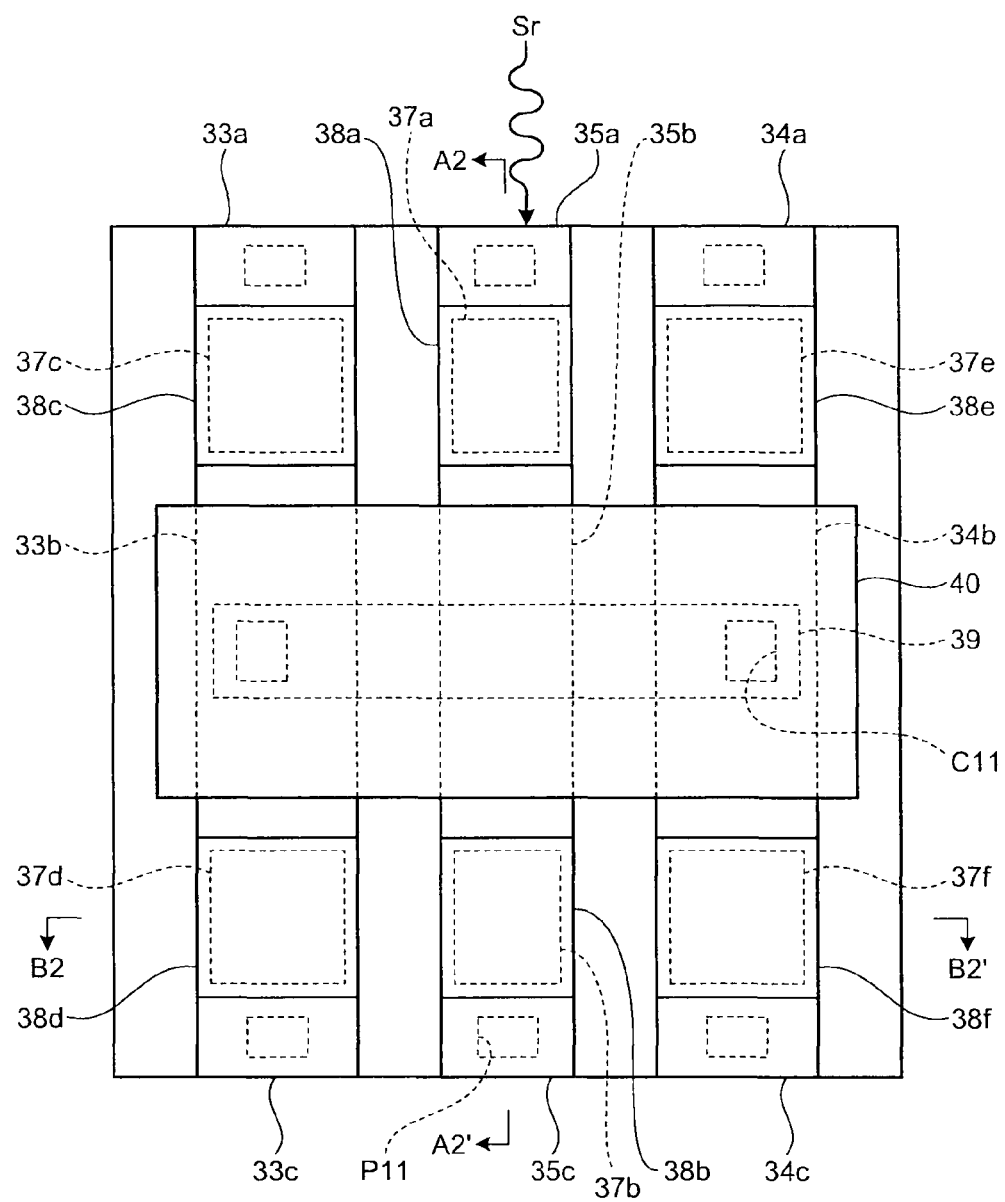
FIG. 5 is a plan view of a schematic configuration of a micro movable device according to a second embodiment of the present invention.
Figure 6A:
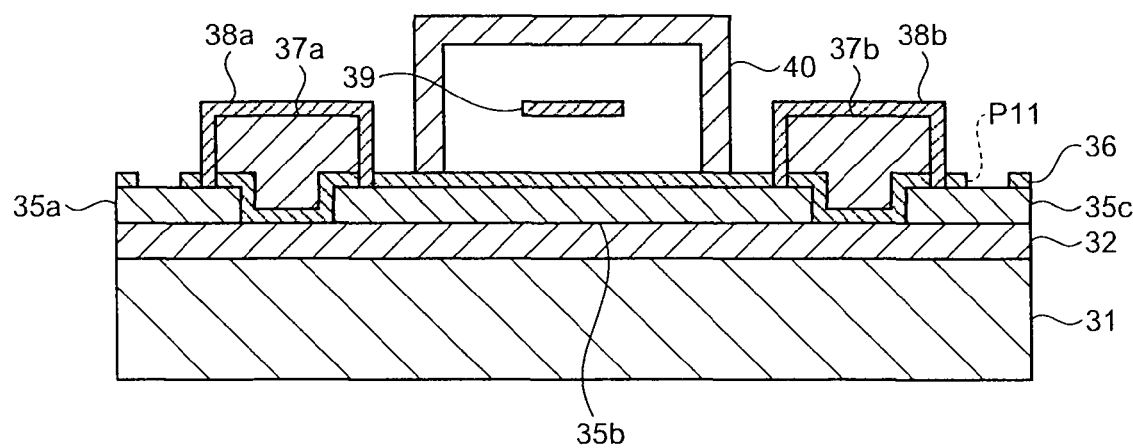
FIG. 6A is a cross-sectional view cut along a line A2-A2' in FIG. 5.
Figure 6B:
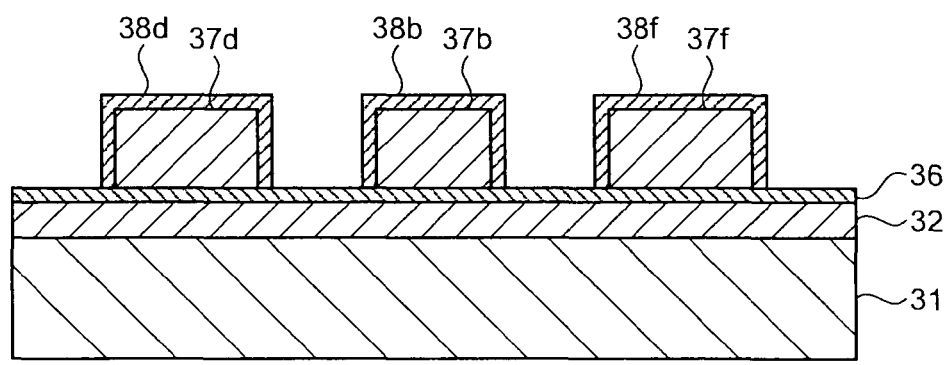
FIG. 6B is a cross-sectional view cut along a line B2-B2' in FIG. 5.

FIG. 5 is a plan view of a schematic configuration of a micro movable device according to a second embodiment of the present invention. FIG. 6A is a cross-sectional view cut along a line A2-A2' in FIG. 5. FIG. 6B is a cross-sectional view cut along a line B2-B2' in FIG. 5.

In FIG. 5 and FIGS. 6A and 6B, an insulation layer 32 is formed on a semiconductor substrate 31. Ground lines 33a to 33c are arranged in a constant direction, and ground lines 34a to 34c are arranged in parallel with the ground lines 33a to 33c, on the insulation layer 32. Signal lines 35a to 35c are arranged between the ground lines 33a to 33c and the ground lines 34a to 34c. The ground lines 33a to 33c are isolated from each other, the ground lines 34a to 34c are isolated from each other, and the signal lines 35a to 35c are isolated from each other.

An insulation layer 36 is formed on the ground lines 33a to 33c, and 34a to 34c, and on the signal lines 35a to 35c. Pads P11 are formed by exposing one ends of the ground lines 33a, 33c, 34a, and 34c and the signal lines 35a and 35c, respectively from the insulation layer 36.

A movable line 39 is formed to stride the signal line 35b above the semiconductor substrate 31, and both ends of the movable line 39 are connected to the ground lines 33b and 34b, respectively via contacts C11. The movable line 39 is supported above the semiconductor substrate 31 to have a gap between the movable line 39 and the signal line 35b, and a cavity is formed between the movable line 39 and the signal line 35b.

A protection cap 40 for protecting the movable line 39 from external pressure is arranged above the semiconductor substrate 31 to have a gap between the pads P11 and the protection cap 40.

At the outside of the protection cap 40, a thick-film insulation layer 37a arranged between the signal lines 35a and 35b is formed, and a thick-film insulation layer 37b arranged between the signal lines 35b and 35c is formed, respectively. At the outside of the protection cap 40, a thick-film insulation layer 37c arranged between the ground lines 33a and 33b is formed, and a thick-film insulation layer 37d arranged between the ground lines 33b and 33c is formed, respectively. Further, at the outside of the protection cap 40, a thick-film insulation layer 37e arranged between the ground lines 34a and 34b is formed, and a thick-film insulation layer 37f arranged between the ground lines 34b and 34c is formed, respectively.

The thick-film insulation layers 37a to 37f can be formed above the semiconductor substrate 31 to project upward from the ground lines 33a to 33c, and 34a to 34c, and from the signal lines 35a to 35c. Signal lines 38a and 38b are formed to coat entire exposed surfaces of the thick-film insulation layers 37a and 37b, respectively. The signal line 38a is connected to the signal lines 35a and 35b, and the signal line 38b is connected to the signal lines 35b and 35c. Ground lines 38c and 38d are formed to coat entire exposed surfaces of the thick-film insulation layers 37c and 37d, respectively. The ground line 38c is connected to the ground lines 33a and 33b, and the ground line 38d is connected to the ground lines 33b and 33c. Ground lines 38e and 38f are formed to coat entire exposed surfaces of the thick-film insulation layers 37e and 37f, respectively. The ground line 38e is connected to the ground lines 34a and 34b, and the ground line 38f is connected to the ground lines 34b and 34c.

With this arrangement, not only parasitic capacitances of the signal lines 38a and 38b can be reduced but also parasitic capacitances of the ground lines 38c to 38f can be reduced without forming cavity structures in the signal lines 35a and 35c and the ground lines 33a, 33c, 34a, and 34c at the outside of the protection cap 40. Therefore, a high-frequency characteristic can be further improved while preventing the signal lines 38a and 38b and the ground lines 38c to 38f from being crushed in the molding process and the like.

A position of the movable line 39 in a height direction and positions of the signal lines 38a and 38b and the ground lines 38c to 38f in a height direction arranged on the thick-film insulation layers 37a to 37f, respectively can be set equal to each other.

Consequently, the thick-film insulation layers 37a to 37f can be formed by using the sacrifice film 17 shown in FIGS. 2A to 2C. In forming the thick-film insulation layers 37c to 37f beneath the ground lines 38c to 38f, a separate provision of a process of forming the thick-film insulation layers 37a to 37f is not necessary. As a result, a manufacturing process can be simplified.

Figure 7:
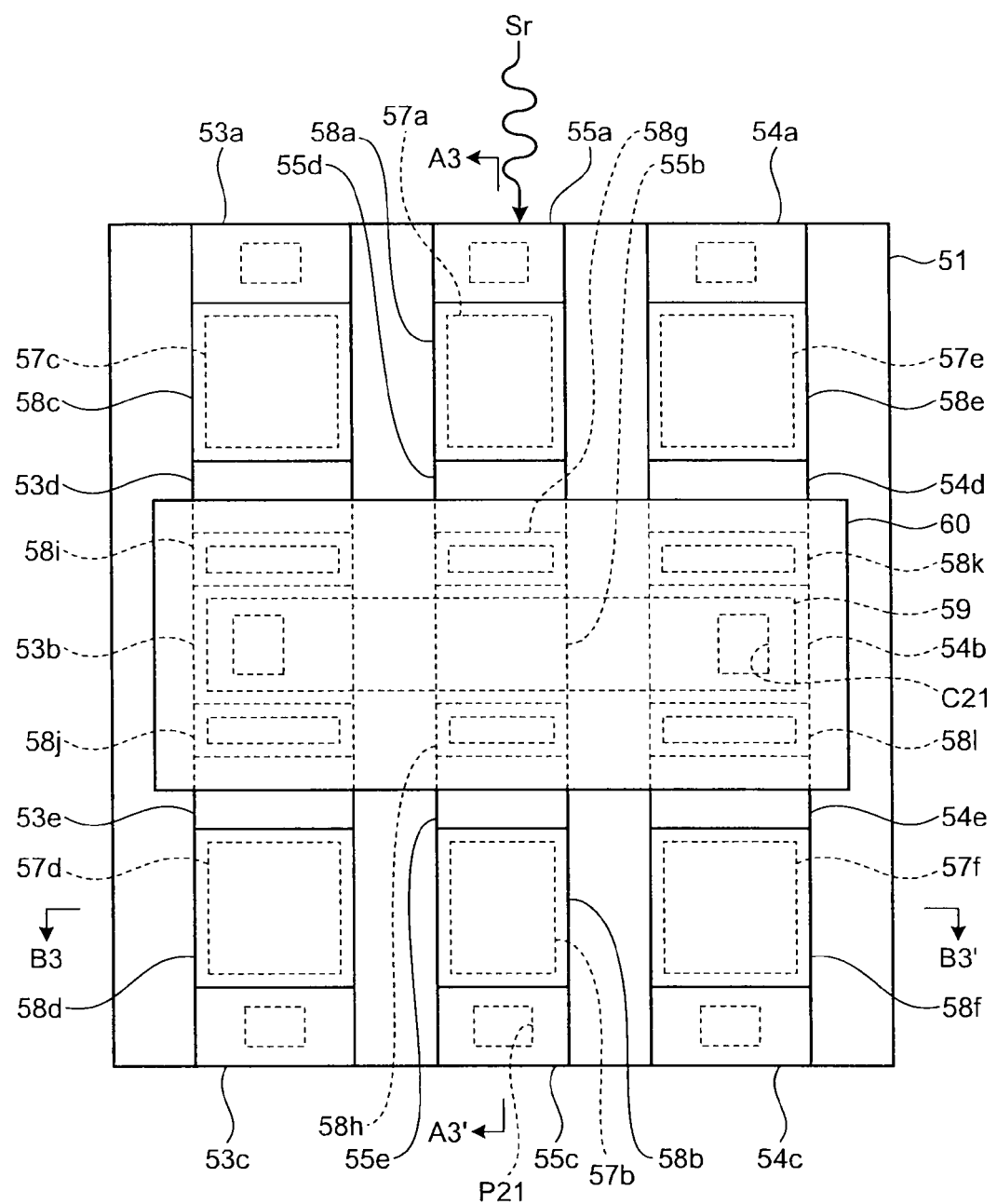
FIG. 7 is a plan view of a schematic configuration of a micro movable device according to a third embodiment of the present invention.
Figure 8A:
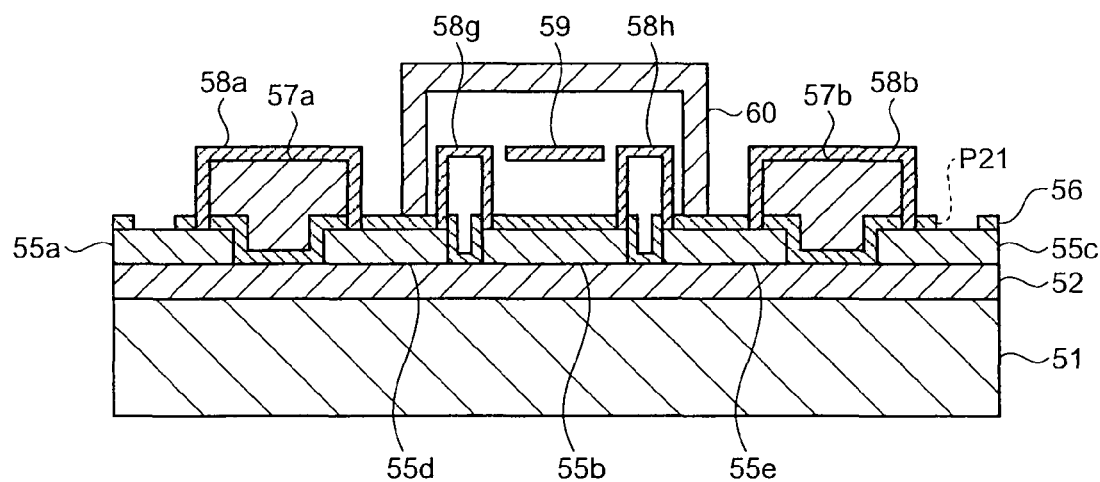
FIG. 8A is a cross-sectional view cut along a line A3-A3' in FIG. 7.
Figure 8B:
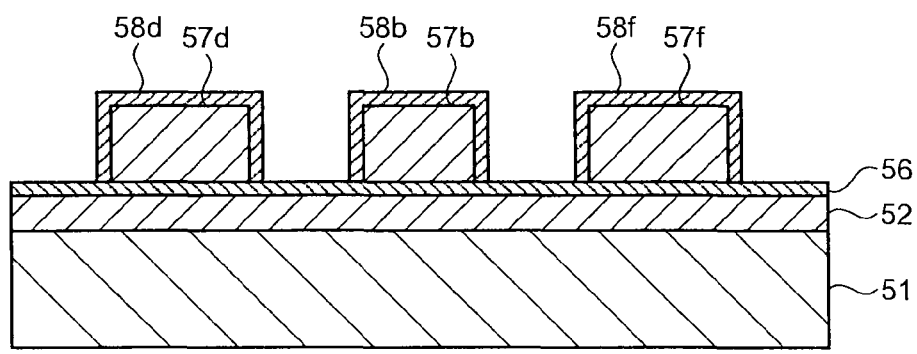
FIG. 8B is a cross-sectional view cut along a line B3-B3' in FIG. 7.

FIG. 7 is a plan view of a schematic configuration of a micro movable device according to a third embodiment of the present invention. FIG. 8A is a cross-sectional view cut along a line A3-A3' in FIG. 7. FIG. 8B is a cross-sectional view cut along a line B3-B3' in FIG. 7.

In FIG. 7 and FIGS. 8A and 8B, an insulation layer 52 is formed on a semiconductor substrate 51. On the insulation layer 52, ground lines 53a to 53e are arranged in a constant direction, ground lines 54a to 54e are arranged in parallel with the ground lines 53a to 53e, and signal lines 55a to 55e are arranged between the ground lines 53a to 53e and 54a to 54e. The ground lines 53a to 53e are isolated from each other, the ground lines 54a to 54e are isolated from each other, and the signal lines 55a to 55e are isolated from each other.

An insulation layer 56 is formed on the ground lines 53a to 53e, and 54a to 54e, and on the signal lines 55a to 55e. Pads P21 are formed by exposing one ends of the ground lines 53a, 53c, 54a, and 54c and the signal lines 55a and 55c, respectively from the insulation layer 56.

A movable line 59 is formed to stride the signal line 55b above the semiconductor substrate 51, and both ends of the movable line 59 are connected to the ground lines 53b and 54b, respectively via contacts C21. The movable line 59 is supported above the semiconductor substrate 51 to have a gap between the movable line 59 and the signal line 55b, and a cavity is formed between the movable line 59 and the signal line 55b.

A protection cap 60 for protecting the movable line 59 from external pressure is arranged above the semiconductor substrate 51 to have a gap between the pads P21 and the protection cap 60.

At the outside of the protection cap 60, a thick-film insulation layer 57a arranged between the signal lines 55a and 55b is formed, and a thick-film insulation layer 57b arranged between the signal lines 55b and 55c is formed, respectively. At the outside of the protection cap 60, a thick-film insulation layer 57c arranged between the ground lines 53a and 53b is formed, and a thick-film insulation layer 57d arranged between the ground lines 53b and 53c is formed, respectively. Further, at the outside of the protection cap 60, a thick-film insulation layer 57e arranged between the ground lines 54a and 54b is formed, and a thick-film insulation layer 57f arranged between the ground lines 54b and 54c is formed, respectively.

The thick-film insulation layers 57a to 57f can be formed above the semiconductor substrate 51 to project upward from the ground lines 53a to 53c, and 54a to 54c, and from the signal lines 55a to 55c. Signal lines 58a and 58b are formed to coat entire exposed surfaces of the thick-film insulation layers 57a and 57b, respectively. The signal line 58a is connected to the signal lines 55a and 55b, and the signal line 58b is connected to the signal lines 55b and 55c. Ground lines 58c and 58d are formed to coat entire exposed surfaces of the thick-film insulation layers 57c and 57d, respectively. The ground line 58c is connected to the ground lines 53a and 53b, and the ground line 58d is connected to the ground lines 53b and 53c. Ground lines 58e and 58f are formed to coat entire exposed surfaces of the thick-film insulation layers 57e and 57f, respectively. The ground line 58e is connected to the ground lines 54a and 54b, and the ground line 58f is connected to the ground lines 54b and 54c.

At the inside of the protection cap 60, a signal line 58g connecting between the signal lines 55b and 55d is formed, a signal line 58h connecting between the signal lines 55b and 55e is formed, and a cavity is formed beneath the signal lines 58g and 58h. At the inside of the protection cap 60, a ground line 58i connecting between the ground lines 53b and 53d is formed, a ground line 58j connecting between the ground lines 53b and 53e is formed, and a cavity is formed beneath the ground lines 58i and 58j. Further, at the inside of the protection cap 60, a ground line 58k connecting between the ground lines 54b and 54d is formed, a ground line 58l connecting between the ground lines 54b and 54d is formed, and a cavity is formed beneath the ground lines 58k and 58l.

With this arrangement, not only parasitic capacitances of the signal lines 58a and 58b and the ground lines 58c to 58f can be reduced but also parasitic capacitances of the signal lines 58g and 58h and the ground lines 58i to 58l at the inside of the protection cap 60 can be reduced without forming cavity structures in the signal lines 55a and 55c and the ground lines 53a, 53c, 54a, and 54c at the outside of the protection cap 60. Therefore, a high-frequency characteristic can be further improved while preventing the signal lines 58a and 58b and the ground lines 58c to 58f from being crushed in the molding process and the like.

A position of the movable line 59 in a height direction, positions of the signal lines 58a and 58b and the ground lines 58c to 58f in a height direction arranged respectively on the thick-film insulation layers 57a to 57f, and positions of the signal lines 58g and 58h and the ground lines 58i to 58l arranged at the inside of the protection cap 60, respectively can be set equal to each other.

For a method of forming cavity structures beneath the signal lines 58g and 58h and the ground lines 58i to 58l, there can be used a method of forming the signal lines 58g and 58h and the ground lines 58i to 58l on the sacrifice film 17 shown in FIGS. 3A to 3C and FIGS. 4A to 4B, and then removing the sacrifice film 17 from beneath the signal lines 58g and 58h and the ground lines 58i to 58l. In removing the sacrifice film 17, to form the thick-film insulation layers 57a to 57f by leaving the sacrifice film 17 beneath the signal lines 58a and 58b and the ground lines 58c to 58f, the signal lines 58a and 58b and the ground lines 58c to 58f coat an entire exposed surface of the sacrifice film 17. To form cavity structures beneath the signal lines 58g and 58h and the ground lines 58i to 58l, the signal lines 58g and 58h and the ground lines 58i to 58l are not formed on sidewalls of the cavity film 17, without coating the entire exposed surface of the sacrifice film 17 by the signal lines 58g and 58h and the ground lines 58i to 58l.

In the third embodiment, there has been explained a method of forming the thick-film insulation layers 57a to 57f beneath the signal lines 58a and 58b and the ground lines 58c to 58f, and thereafter forming cavities beneath the signal lines 58g and 58h and the ground lines 58i to 58l. Alternatively, the thick-film insulation layers 57a and 57b can be formed only beneath the signal lines 58a and 58b, and at the same time, cavities can be formed only beneath the signal lines 58g and 58h.

Figure 9:
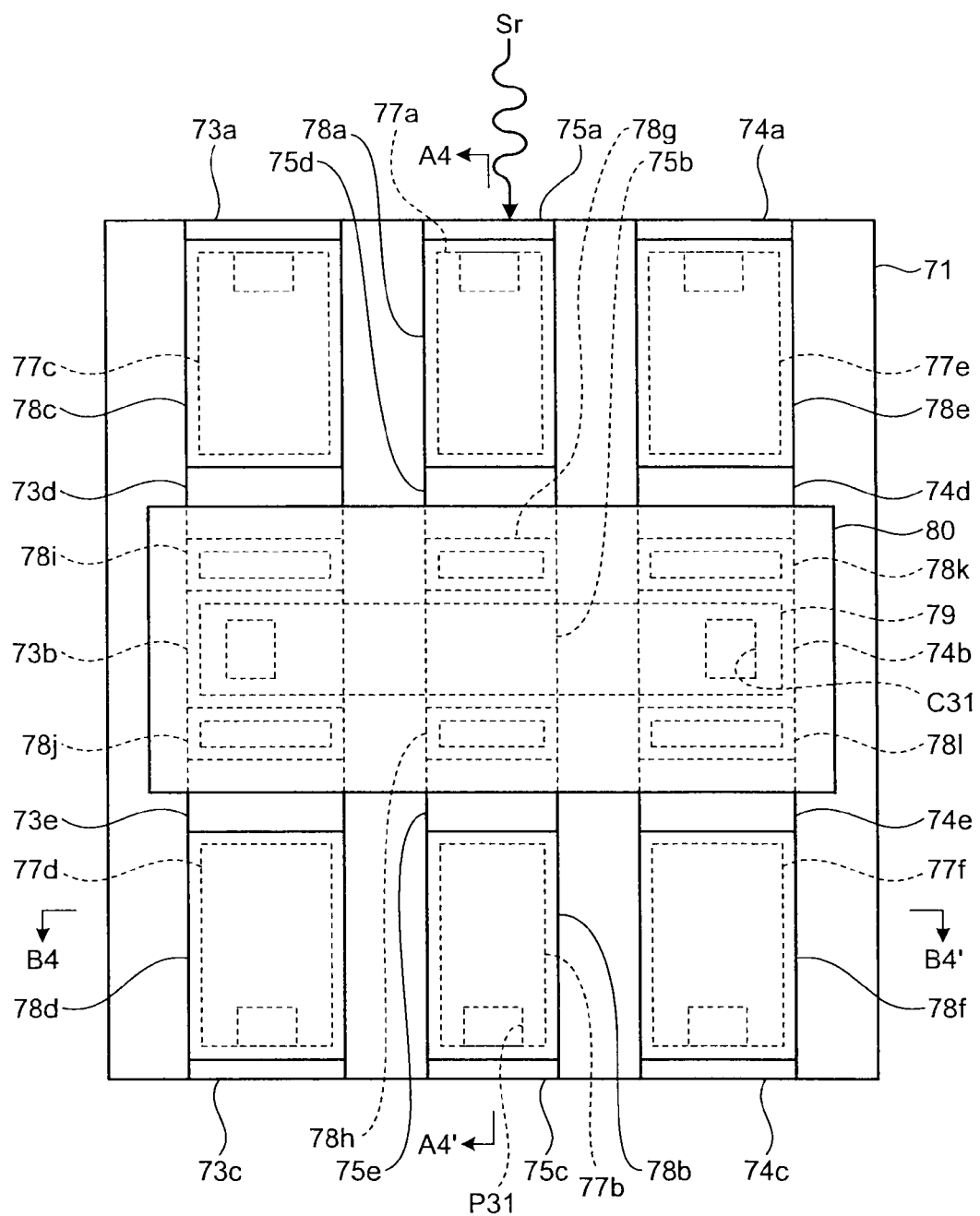
FIG. 9 is a plan view of a schematic configuration of a micro movable device according to a fourth embodiment of the present invention.
Figure 10A:
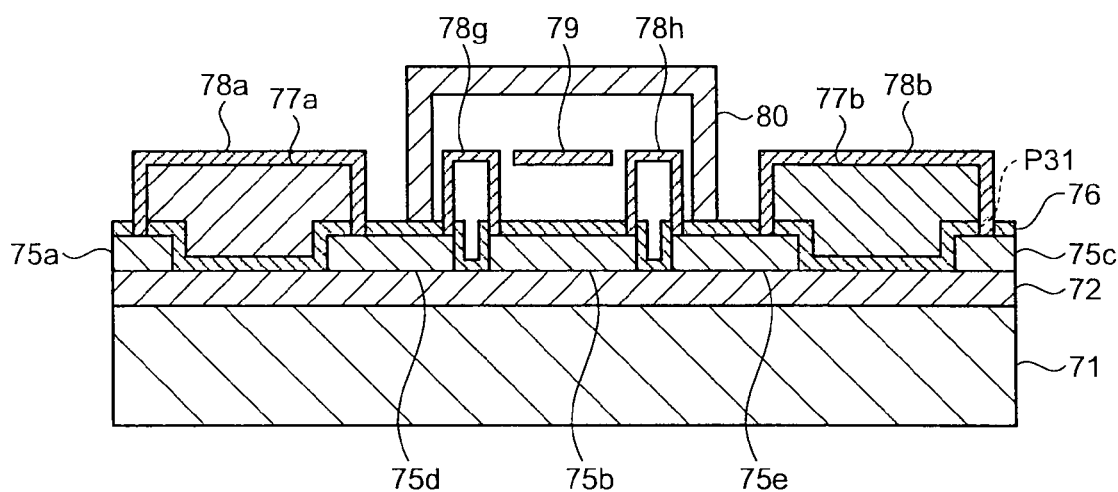
FIG. 10A is a cross-sectional view cut along a line A4-A4' in FIG. 9.
Figure 10B:
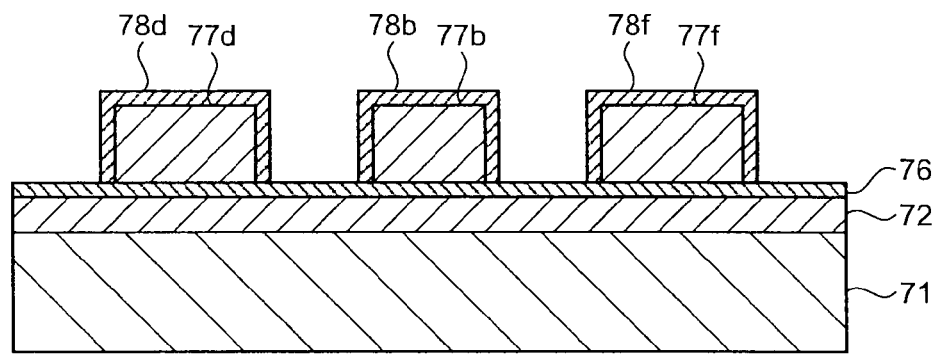
FIG. 10B is a cross-sectional view cut along a line B4-B4' in FIG. 9.

FIG. 9 is a plan view of a schematic configuration of a micro movable device according to a fourth embodiment of the present invention. FIG. 10A is a cross-sectional view cut along a line A4-A4' in FIG. 9. FIG. 10B is a cross-sectional view cut along a line B4-B4' in FIG. 9.

In FIG. 9 and FIGS. 10A and 8B, an insulation layer 72 is formed on a semiconductor substrate 71. On the insulation layer 72, ground lines 73a to 73e are arranged in a constant direction, ground lines 74a to 74e are arranged in parallel with the ground lines 73a to 73e, and signal lines 75a to 75e are arranged between the ground lines 73a to 73e and 74a to 74e. The ground lines 73a to 73e are isolated from each other, the ground lines 74a to 74e are isolated from each other, and the signal lines 75a to 75e are isolated from each other. An insulation layer 76 is formed on the ground lines 73a to 73e, 74a to 74e, and on the signal lines 75a to 75e.

Further, a movable line 79 is formed to stride the signal line 75b above the semiconductor substrate 71, and both ends of the movable line 79 are connected to the ground lines 73b and 74b, respectively via contacts C31. The movable line 79 is supported above the semiconductor substrate 71 to have a gap between the movable line 79 and the signal line 75b, and a cavity is formed between the movable line 79 and the signal line 75b. A protection cap 80 for protecting the movable line 79 from external pressure is arranged above the semiconductor substrate 71.

At the outside of the protection cap 80, a thick-film insulation layer 77a arranged between the signal lines 75a and 75b is formed, and a thick-film insulation layer 77b arranged between the signal lines 75b and 75c is formed, respectively. At the outside of the protection cap 80, a thick-film insulation layer 77c arranged between the ground lines 73a and 73b is formed, and a thick-film insulation layer 77d arranged between the ground lines 73b and 73c is formed, respectively. Further, at the outside of the protection cap 80, a thick-film insulation layer 77e arranged between the ground lines 74a and 74b is formed, and a thick-film insulation layer 77f arranged between the ground lines 74b and 74c is formed, respectively.

The thick-film insulation layers 77a to 77f can be formed above the semiconductor substrate 71 to project upward from the ground lines 73a to 73c, and 74a to 74c, and from the signal lines 75a to 75c. Signal lines 78a and 78b are formed to coat entire exposed surfaces of the thick-film insulation layers 77a and 77b, respectively. The signal line 78a is connected to the signal lines 75a and 75b, and the signal line 78b is connected to the signal lines 75b and 75c. Ground lines 78c and 78d are formed to coat entire exposed surfaces of the thick-film insulation layers 77c and 77d, respectively. The ground line 78c is connected to the ground lines 73a and 73b, and the ground line 78d is connected to the ground lines 73b and 73c. Ground lines 78e and 78f are formed to coat entire exposed surfaces of the thick-film insulation layers 77e and 77f, respectively. The ground line 78e is connected to the ground lines 74a and 74b, and the ground line 78f is connected to the ground lines 74b and 74c.

Pads P31 are provided at one ends of the signal lines 75a and 75c and the ground lines 73a, 73c, 74a, and 74c, respectively formed on the thick-film insulation layers 77a to 77f, respectively.

Further, at the inside of the protection cap 80, a signal line 78g connecting between the signal lines 75b and 75d is formed, a signal line 78h connecting between the signal lines 75b and 75e is formed, and a cavity is formed beneath the signal lines 78g and 78h. At the inside of the protection cap 80, a ground line 78i connecting between the ground lines 73b and 73d is formed, a ground line 78j connecting between the ground lines 73b and 73e is formed, and a cavity is formed beneath the ground lines 78i and 78j. Further, at the inside of the protection cap 80, a ground line 78k connecting between the ground lines 74b and 74d is formed, a ground line 78l connecting between the ground lines 74b and 74d is formed, and a cavity is formed beneath the ground lines 78k and 78l.

With this arrangement, not only parasitic capacitances of the signal lines 78a, 78b, 78g and 78h and the ground lines 78c to 78f and 78i to 78l can be reduced but also parasitic capacitance of the pads P31 can be reduced without complicating a manufacturing process and without forming cavity structures in the signal lines 75a and 75c and the ground lines 73a, 73c, 74a, and 74c at the outside of the protection cap 80. Therefore, a high-frequency characteristic can be further improved while preventing the signal lines 78a and 78b and the ground lines 78c to 78f from being crushed in the molding process and the like. Further, even when the thick-film insulation layers 77a to 77f are provided, cost increase can be suppressed.

In the fourth embodiment, there has been explained a method of forming the thick-film insulation layers 77a to 77f beneath the signal lines 78a and 78b and the ground lines 78c to 78f, and thereafter forming cavities beneath the signal lines 78g and 78h and the ground lines 78i to 78l. Alternatively, the thick-film insulation layers 77a and 77b can be formed only beneath the signal lines 78a and 78b, and thereafter, cavities can be formed only beneath the signal lines 78g and 78h.

The signal lines 75b, 75d, and 75e can be directly connected together, the ground lines 73b, 73d, and 73e can be directly connected together, and the ground lines 74b, 74d, and 74e can be directly connected together, and provision of the signal lines 78g and 78h and the ground lines 78i to 78l can be avoided, instead of isolating between the signal lines 75b, 75d, and 75e, between the ground lines 73b, 73d, and 73e, and between the ground lines 74b, 74d, and 74e, respectively.

In the fourth embodiment, there has been explained a method of providing the pads P31 on the signal lines 78a and 78b and on the ground lines 78c to 78f. Alternatively, the pads P1 can be provided on the signal lines 18a and 18b shown in FIG. 1, or the pads P11 can be provided on the signal lines 38a and 38b and on the ground lines 38c to 38f shown in FIG. 5.

Figure 11:
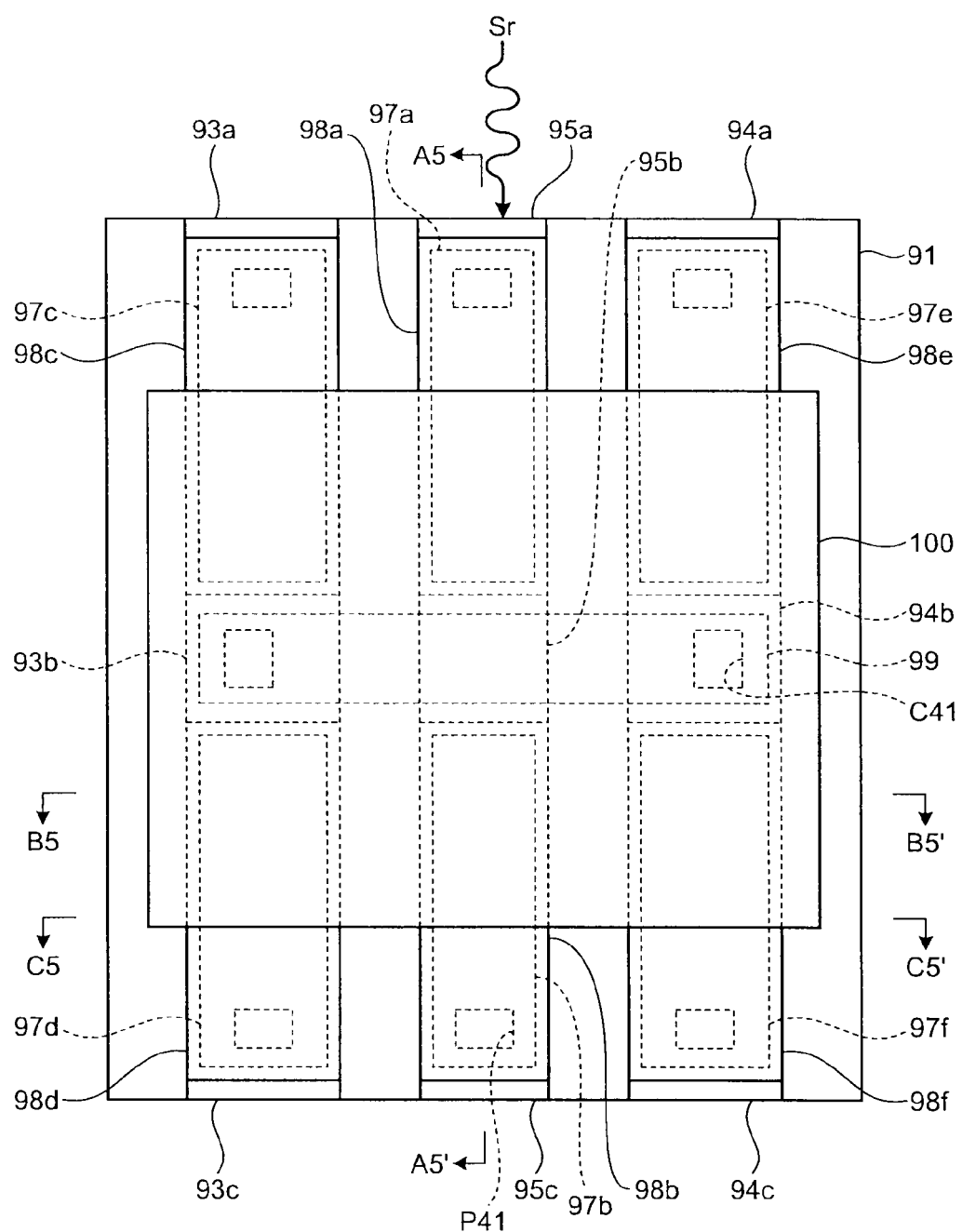
FIG. 11 is a plan view of a schematic configuration of a micro movable device according to a fifth embodiment of the present invention.
Figure 12A:
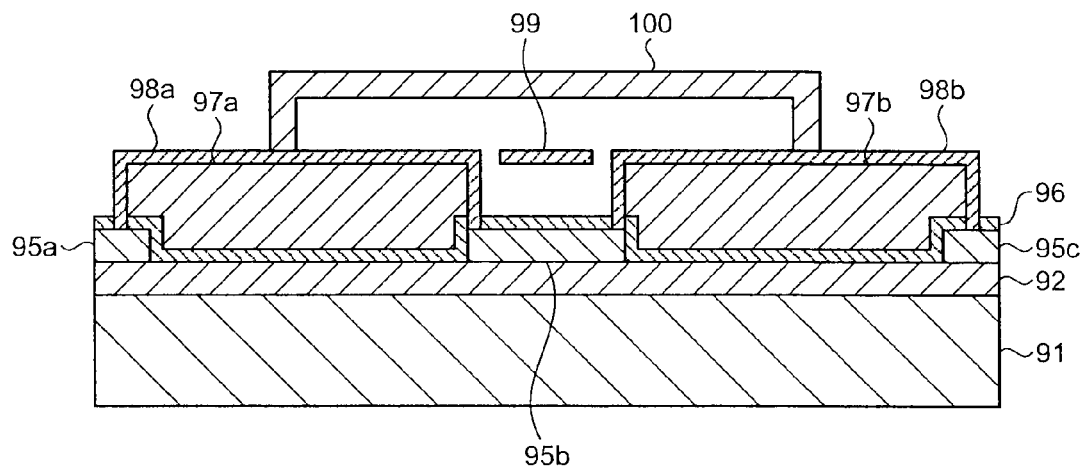
FIG. 12A is a cross-sectional view cut along a line A5-A5' in FIG. 11.
Figure 12B:
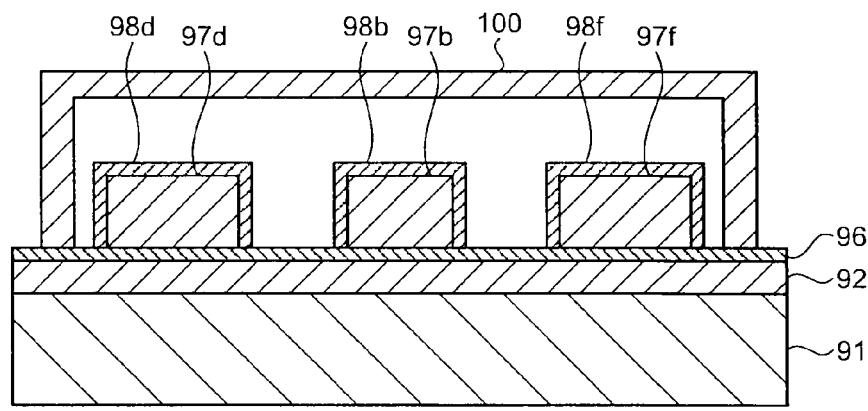
FIG. 12B is a cross-sectional view cut along a line B5-B5' in FIG. 11.
Figure 12C:
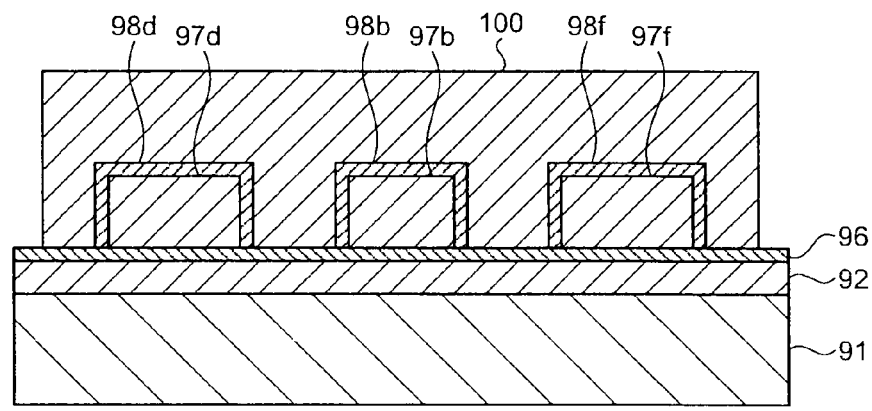
FIG. 12C is a cross-sectional view cut along a line C5-C5' in FIG. 11.

FIG. 11 is a plan view of a schematic configuration of a micro movable device according to a fifth embodiment of the present invention. FIG. 12A is a cross-sectional view cut along a line A5-A5' in FIG. 11. FIG. 12B is a cross-sectional view cut along a line B5-B5' in FIG. 11. FIG. 12C is a cross-sectional view cut along a line C5-C5' in FIG. 11.

In FIG. 11 and FIGS. 12A to 12C, an insulation layer 92 is formed on a semiconductor substrate 91. On the insulation layer 92, ground lines 93a to 93c are arranged in a constant direction, ground lines 94a to 94c are arranged in parallel with the ground lines 93a to 93c, and signal lines 95a to 95c are arranged between the ground lines 93a to 93c and 94a to 94c. The ground lines 93a to 93c are isolated from each other, the ground lines 94a to 94c are isolated from each other, and the signal lines 95a to 95c are isolated from each other.

An insulation layer 96 is formed on the ground lines 93a to 93c, 94a to 94c, and on the signal lines 95a to 95c. Pads P41 are formed by exposing one ends of the ground lines 93a, 93c, 94a, and 94c and the signal lines 95a and 95c, respectively from the insulation layer 96.

Further, a movable line 99 is formed to stride the signal line 95b above the semiconductor substrate 91, and both ends of the movable line 99 are connected to the ground lines 93b and 94b, respectively via contacts C41. The movable line 99 is supported above the semiconductor substrate 91 to have a gap between the movable line 99 and the signal line 95b, and a cavity is formed between the movable line 99 and the signal line 95b.

A thick-film insulation layer 97a is formed between the signal lines 95a and 95b, and a thick-film insulation layer 97b is formed between the signal lines 95b and 95c. A thick-film insulation layer 97c is formed between the ground lines 93a and 93b, and a thick-film insulation layer 97d is formed between the ground lines 93b and 93c. A thick-film insulation layer 97e is formed between the ground lines 94a and 94b, and a thick-film insulation layer 97f is formed between the ground lines 94b and 94c.

The thick-film insulation layers 97a to 97f can be formed above the semiconductor substrate 91 to project upward from the ground lines 93a to 93c, and 94a to 94c, and from the signal lines 95a to 95c. Signal lines 98a and 98b are formed to coat entire exposed surfaces of the thick-film insulation layers 97a and 97b, respectively. The signal line 98a is connected to the signal lines 95a and 95b, and the signal line 98b is connected to the signal lines 95b and 95c. Ground lines 98c and 98d are formed to coat entire exposed surfaces of the thick-film insulation layers 97c and 97d, respectively. The ground line 98c is connected to the ground lines 93a and 93b, and the ground line 98d is connected to the ground lines 93b and 93c. Ground lines 98e and 98f are formed to coat entire exposed surfaces of the thick-film insulation layers 97e and 97f, respectively. The ground line 98e is connected to the ground lines 94a and 94b, and the ground line 98f is connected to the ground lines 94b and 94c.

The pads P41 are provided at one ends of the signal lines 95a and 95c and the ground lines 93a, 93c, 94a, and 94c, respectively formed on the thick-film insulation layers 97a to 97f, respectively. A protection cap 100 for protecting the movable line 99 from external pressure is arranged above the semiconductor substrate 91 to have a gap between the pads P41 and the protection cap 100.

With this arrangement, parasitic capacitances of the signal lines 95a and 95c and the ground lines 93a, 93c, 94a, and 94c in a wiring region at the inside of the protection cap 100 to a wiring region at the outside of the protection cap 100 can be reduced without forming cavity structures in the signal lines 95a and 95c and the ground lines 93a, 93c, 94a, and 94c. Therefore, a high-frequency characteristic can be further improved while preventing the signal lines 98a and 98b and the ground lines 98c to 98f from being crushed in the molding process and the like.

In the fifth embodiment, there has been explained a method of forming the thick-film insulation layers 97a to 97f beneath the signal lines 98a and 98b and the ground lines 98c to 98f. Alternatively, the thick-film insulation layers 97a and 97b can be formed only beneath the signal lines 98a and 98b.

In the fifth embodiment, there has been explained a method of forming the pads P41 in the signal lines 95a and 95c and the ground lines 93a, 93c, 94a, and 94c formed respectively on the thick-film insulation layers 97a to 97f. Alternatively, the pads P41 can be formed in the ground lines 93a, 93c, 94a, and 94c and the signal lines 95a and 95c.

While a capacitive switch has been exemplified in the above embodiments, the present invention can be also applied to other high-frequency elements such as a variable capacitor or a resonator. In the above embodiments, while there has been explained a method of superimposing a drive signal of a movable line on a signal line for transmitting a high-frequency signal, a drive line for transmitting a drive signal of a movable line can be provided separately from a signal line for transmitting a high-frequency signal.

Figure 13:
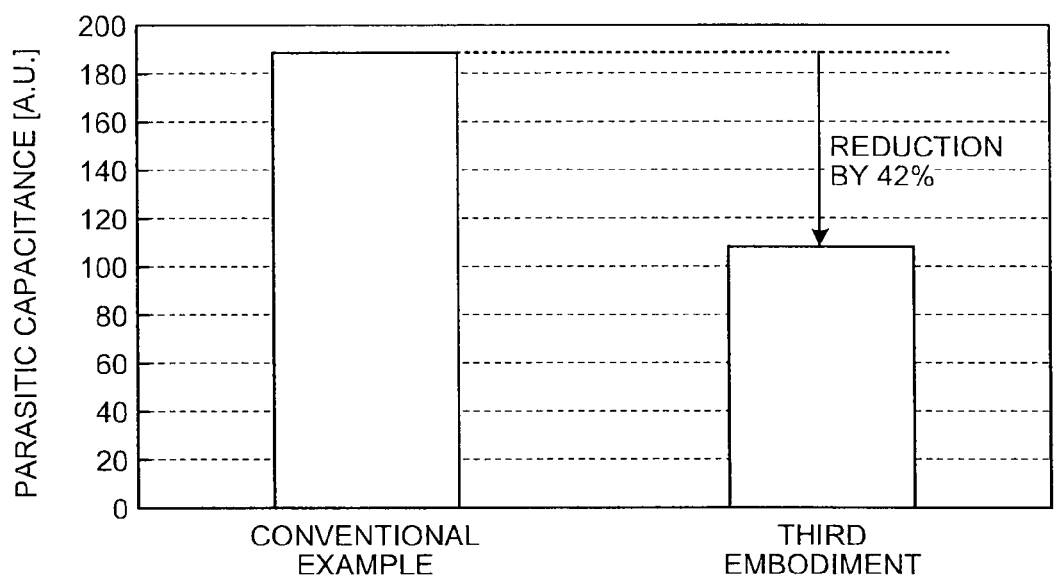
FIG. 13 is a cross-sectional view of a value of a parasitic capacitance between a semiconductor substrate and a wiring layer according to the third embodiment in comparison with a parasitic capacitance value according to a conventional example.

FIG. 13 is a cross-sectional view of a value of a parasitic capacitance between a semiconductor substrate and a wiring layer according to the third embodiment in comparison with a parasitic capacitance value according to a conventional example.

When the thick-film insulation layers 57a to 57f are formed beneath the signal lines 58a and 58b and beneath the ground lines 58c to 58f, and thereafter, when cavities are formed beneath the signal lines 58g and 58h and the ground lines 58i to 58l as shown in FIG. 7 and FIG. 8, it can be confirmed from FIG. 13 that 42% of parasitic capacitances between the semiconductor substrate 51 and these signal lines and the ground lines can be reduced as compared with the parasitic capacitances when the thick-film insulation layers 57a to 57f and the cavities are not formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A micro movable device comprising:
   a movable unit formed above a semiconductor substrate;
   a protection cap that is arranged above the semiconductor substrate and the movable unit and protects the movable unit;
   a signal line that is formed above the semiconductor substrate and transmit a high-frequency signal, a part of the signal line being provided below the movable unit; and
   an insulation layer that has a projection formed to project upward from the semiconductor substrate, the projection being provided at outside of the movable unit in a plain view and being formed at an outside of the protection cap and the insulation layer having coated upper and side surfaces with the signal line, the coated surfaces being provided in a higher position than a bottom of the signal line below the movable unit, wherein
   a position of the signal line on the upper surface of the projection in a height direction is higher than a position of the signal line under the movable unit in a height direction.

2. The micro movable device according to claim 1, wherein a position of the movable unit in a height direction is substantially equal to position of the signal line in a height direction arranged on the insulation layer.

3. The micro movable device according to claim 1, wherein the projection is formed at only outside of the protection cap.

4. The micro movable device according to claim 1, further comprising a pad formed on the signal line coating the projection.

5. The micro movable device according to claim 1, wherein the projection is formed at inside and the outside of the protection cap.

6. The micro movable device according to claim 1, wherein a drive signal for driving the movable unit is input to the signal line.

7. The micro movable device according to claim 1, further comprising a ground line that is arranged above the semiconductor substrate and is connected to the movable unit.

8. The micro movable device according to claim 1, further comprising a cavity formed beneath a portion of the signal line arranged at the inside of the protection cap.

9. A micro movable device comprising:
   a movable unit formed above a semiconductor substrate;
   a first insulation layer formed above the semiconductor substrate below the movable unit with a gap between the movable unit and the first insulation layer;
   a protection cap that is arranged above the first insulation layer and the movable unit and protects the movable unit;
   a first signal line that is arranged at inside of the protection cap and is formed on the first insulation layer with a gap between the movable unit and the first signal line and a part of the first signal line being provided below the movable unit and the first insulation layer;

a second insulation layer that are arranged at outside of the protection cap and has a projection formed to project upward from the first insulation layer; and a second signal line electrically connected to the first signal line, and coating upper and side surfaces of the projection of the second insulation layer, the second signal line being provided in a higher position than the part of the first signal line.

10. The micro movable device according to claim 9, wherein a position of the movable unit in a height direction is substantially equal to a position of the second signal line in a height direction arranged on the insulation layer.

11. The micro movable device according to claim 9, wherein the movable unit and the second signal line are configured by a substantially same metal film.

12. The micro movable device according to claim 9, further comprising a pad formed on the second signal line.

13. The micro movable device according to claim 9, wherein a drive signal for driving the movable unit is input to the first signal line and the second signal line.

14. The micro movable device according to claim 9, further comprising a ground line that is arranged above the semiconductor substrate and is connected to the movable unit.

15. The micro movable device according to claim 9, further comprising a cavity formed beneath a portion of the first signal line.

16. A micro movable device comprising:
a movable unit formed above a semiconductor substrate;
a first insulation layer formed above the semiconductor substrate below the movable unit with a gap between the movable unit and the insulation layer;
a protection cap that is arranged above the first insulation layer and the movable unit and protects the movable unit;
a first signal line that is arranged at inside of the protection cap and is formed on the first insulation layer with a gap between the movable unit and the first signal line;
a second insulation layer that is arranged at outside of the protection cap and has a projection formed to project upward from the first insulation layer;
a second signal line electrically connected to the first signal line, and coating a surface of the projection of the second insulation layer;
a first ground line that is arranged at inside of the protection cap and is formed on the first insulation layer;
a third insulation layer that is arranged at outside of the protection cap and has a projection formed to project upward from the first insulation layer; and
a second ground line electrically connected to the first ground line and coating an entire exposed surface of the third insulation layer.

17. The micro movable device according to claim 16, wherein a position of the movable unit in a height direction, a position of the second signal line in a height direction arranged on the second insulation layer, and a position of the second ground line in a height direction arranged on the third insulation layer are substantially equal.

18. The micro movable device according to claim 16, wherein the movable unit, the second signal line, and the second ground line are configured by a substantially same metal film.

19. The micro movable device according to claim 16, further comprising a first pad formed on the second signal line and a second pad formed on the second ground line.

20. The micro movable device according to claim 16, further comprising a first cavity formed beneath the first signal line and a second cavity formed beneath the first ground line.

* * * * *